United States Patent
Swaenen et al.

(10) Patent No.: US 10,261,423 B2
(45) Date of Patent: Apr. 16, 2019

(54) LITHOGRAPHIC METHOD AND APPARATUS

(71) Applicant: ASML Netherlands B.V., Veldhoven (NL)

(72) Inventors: Lense Hendrik-Jan Maria Swaenen, Hoogstraten (BE); Johannes Jacobus Matheus Baselmans, Oirschot (NL); Bogathi Vishnu Vardhana Reddy, Eindhoven (NL); Patricius Aloysius Jacobus Tinnemans, Hapert (NL); Beeri Nativ, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/573,029

(22) PCT Filed: May 30, 2016

(86) PCT No.: PCT/EP2016/062131
§ 371 (c)(1),
(2) Date: Nov. 9, 2017

(87) PCT Pub. No.: WO2016/206916
PCT Pub. Date: Dec. 29, 2016

(65) Prior Publication Data
US 2018/0107120 A1    Apr. 19, 2018

(30) Foreign Application Priority Data
Jun. 22, 2015    (EP) .................................... 15173107

(51) Int. Cl.
*G03F 7/20*    (2006.01)

(52) U.S. Cl.
CPC .............. *G03F 7/7055* (2013.01); *G03F 7/20* (2013.01); *G03F 7/705* (2013.01); *G03F 7/70258* (2013.01); *G03F 7/70525* (2013.01)

(58) Field of Classification Search
CPC . G03F 7/70258; G03F 7/7055; G03F 7/70525
(Continued)

(56) References Cited

U.S. PATENT DOCUMENTS 7,506,299 B2 * 3/2009 Socha ....................... G03F 1/36
716/132
8,203,696 B2 * 6/2012 Bittner ................ G03F 7/70266
355/55

(Continued)

FOREIGN PATENT DOCUMENTS

JP    2012-503870 A    2/2012
JP    2012-104821 A    5/2012

OTHER PUBLICATIONS

International Search Report and Written Opinion of the International Searching Authority directed to related International Patent Application No. PCT/EP2016/062131, dated Oct. 7, 2016; 8 pages.
(Continued)

*Primary Examiner* — Hung Nguyen
(74) *Attorney, Agent, or Firm* — Sterne, Kessler, Goldstein & Fox P.L.L.C.

(57) ABSTRACT

A method of determining a configuration of a projection system for a lithographic apparatus, wherein manipulators of the projection system manipulate optical elements so as to adjust its optical properties, the method comprising: receiving dependencies of the optical properties of the projection system on a configuration of the manipulators, receiving a plurality of constraints of the manipulators, formulating a cost function, wherein the cost function represents a difference between the optical properties of the projection system for a given configuration of the manipulators and desired
(Continued)

optical properties, wherein the cost function is formulated using the dependency of the optical properties on the configuration of the manipulators, scaling the cost function into a scaled variable space, wherein the scaling is performed by using the plurality of constraints and finding a solution configuration of the manipulators which substantially minimizes the scaled cost function subject to satisfying the plurality of constraints.

20 Claims, 8 Drawing Sheets

(58) Field of Classification Search
USPC .......................................... 355/52, 53, 55, 67
See application file for complete search history.

(56) References Cited

U.S. PATENT DOCUMENTS

| | | |
|---|---|---|
| 9,354,524 B2 | 5/2016 | Bittner et al. |
| 9,588,438 B2 | 3/2017 | Hsu et al. |
| 2005/0142470 A1 | 6/2005 | Socha et al. |
| 2008/0226157 A1 | 9/2008 | Stokowski |
| 2010/0302524 A1 | 12/2010 | Shigenobu et al. |
| 2011/0181855 A1 | 7/2011 | Bittner et al. |
| 2012/0113404 A1* | 5/2012 | Hsu ..................... G03F 7/70066 355/67 |
| 2013/0258302 A1 | 10/2013 | Bittner et al. |
| 2014/0176924 A1 | 6/2014 | Bittner et al. |
| 2014/0313499 A1 | 10/2014 | Fukagawa et al. |

OTHER PUBLICATIONS

International Preliminary Report on Patentability directed to related International Patent Application No. PCT/EP2016/062131, dated Dec. 26, 2017; 6 pages.

Chapman et al., "A Rigorous Method for Compensation Selection and Alignment of Microlithographic Optical Systems," 23$^{rd}$ Annual International Symposium on Microlithography, Feb. 22-27, 1998; 15 pages.

Bardsley et al., "Structured Linear Algebra Problems in Adaptive Optics Imaging," Advances in Computational Mathematics, vol. 35, Nov. 1, 2011; pp. 1-16.

Japanese Notice of Reasons for Rejection with Translation attached directed to related Japanese Patent Application Publication No. JP 2018-520374 A, dated Nov. 12, 2018; 5 pages.

Japanese Search Report by Registered Searching Organization with Translation attached directed to related Japanese Patent Application Publication No. JP 2018-520374 A, dated Oct. 31, 2018; 32 pages.

* cited by examiner

LITHOGRAPHIC METHOD AND APPARATUS

CROSS-REFERENCE TO RELATED APPLICATION

This application claims priority of 15173107.2 which was filed on 22 Jun. 2015 and which is incorporated herein in its entirety by reference.

FIELD

The present invention relates to a method of determining a configuration of a projection system. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Radiation that has been patterned by the patterning device is focussed onto the substrate using a projection system. The projection system may include a plurality of optical elements (e.g. lenses) which may be adjusted using one or more manipulators. The manipulators may be controlled in order to bring about a desired wavefront at the substrate. For example, a configuration of the manipulators which brings about a desired wavefront at the substrate may be determined and the manipulators moved into that configuration.

It is an object of the present invention to provide a method of determining a configuration of a projection system which at least partially addresses one or more of the problems of the prior art, whether identified herein or elsewhere.

SUMMARY

According to a first aspect of the invention, there is provided a method of determining a configuration of a projection system for a lithographic apparatus, wherein the projection system comprises a plurality of optical elements and a plurality of manipulators and wherein the manipulators are operable to manipulate the optical elements so as to adjust the optical properties of the optical elements, thereby adjusting the optical properties of the projection system, the method comprising: receiving dependencies of the optical properties of the projection system on a configuration of the manipulators, receiving a plurality of constraints which correspond to the physical constraints of the manipulators, formulating a cost function, wherein the cost function represents a difference between the optical properties of the projection system for a given configuration of the manipulators and desired optical properties of the projection system, wherein the cost function is formulated using the dependency of the optical properties of the projection system on the configuration of the manipulators, scaling the cost function into a scaled variable space, wherein the scaling is performed by using the plurality of constraints and finding a solution configuration of the manipulators which substantially minimises the scaled cost function subject to satisfying the plurality of constraints.

Scaling the cost function using the plurality of constraints advantageously allows the scaled cost function to be substantially minimised using a method which is relatively computationally inexpensive and which allows a solution to be found which is relatively close to an optimum solution. The first aspect therefore advantageously provides a method which can be performed quickly and which can find a solution configuration of the manipulators which is close to an optimum solution. This may allow the configuration of the manipulators to be quickly and accurately updated during a lithographic process and/or between lithographic processes.

Finding a solution configuration of the manipulators may comprise calculating iterative adjustments to the configuration of the manipulators and calculating corresponding values of the scaled cost function.

Calculating iterative adjustments to the configuration of the manipulators may comprise calculating adjustments which seek to minimise the scaled cost function.

Calculating iterative adjustments to the configuration of the manipulators may comprise calculating adjustments which reduce the value of the scaled cost function.

Finding a solution configuration of the manipulators may comprise performing a factorization of a matrix which represents the dependency of the optical properties of the projection system on the configuration of the manipulators.

The factorization may be a singular value decomposition.

The singular value decomposition may be a generalized singular value decomposition.

The generalized singular value decomposition may be a generalized singular value decomposition of the matrix which represents the dependency of the optical properties of the projection system on the configuration of the manipulators and a matrix which represents the plurality of constraints.

Finding a solution configuration of the manipulators may further comprise applying a filter function to singular values which result from the factorization, so as to control the contribution of the singular values to the solution configuration of the manipulators.

The filtering may comprise a discontinuous filter function.

Finding a solution configuration of the manipulators may further comprise assigning an index to each singular value wherein the index increases with decreasing singular value size and determining a truncation index at which to truncate the contribution of the singular values, wherein the singular values having an index less than or equal to the truncation index contribute to the solution configuration of the manipulators and wherein the singular values having an index greater than the truncation index do not contribute to the solution configuration of the manipulators, wherein determining the truncation index comprises finding a truncation index at which the scaled cost function is substantially minimised subject to satisfying the plurality of constraints.

The filtering may comprise a continuous filter function.

The continuous filter function may include a regularization parameter.

The filter function $j_i$ may be of the form $$j_i = \frac{\gamma_i^2}{\gamma_i^2 + \beta_i^2}$$

wherein, $\gamma_i$ are the generalized singular values which result from a generalized singular value decomposition of a matrix which represents the dependency of the optical properties of the projection system on the configuration of the manipulators and a matrix which represents the plurality of constraints, wherein $\beta_i$ is the regularization parameter and wherein i is an index assigned to each generalized singular value, wherein the index increases with decreasing generalized singular value size.

Finding a solution configuration of the manipulators may further comprise determining a regularization parameter at which the scaled cost function is substantially minimised subject to satisfying the constraints.

Finding a solution configuration of the manipulators may comprise using a quadratic penalty method.

The method may further comprise applying a weighting to the cost function such that some desired optical properties of the projection system are assigned a greater weighting than other desired optical properties of the projection system.

The method may further comprise determining if any of the plurality of constraints are redundant, and discarding any redundant constraints from the plurality of constraints.

Finding a solution configuration of the manipulators may comprise setting an initial estimate of the configuration of the manipulators and iteratively updating the estimate of the configuration of the manipulators in order to seek a substantial minimum of the scaled cost function whilst satisfying the constraints.

Iteratively updating the estimate of the configuration of the manipulators may comprise iteratively updating an estimate of a scaled configuration of the manipulators, wherein the scaled configuration of the manipulators comprises a configuration of the manipulators scaled so as to satisfy the constraints.

Iteratively updating the estimate of the configuration of the manipulators may comprise using a minimum finding method.

The minimum finding method may comprise a golden section search.

Setting an initial estimate of the configuration of the manipulators may comprise setting the initial value to a value which is substantially at a geometric centre of a variable space which is spanned by the constraints.

The method may further comprise determining the dependency of the optical properties of the projection system on the configuration of the manipulators.

Determining the dependency of the optical properties of the projection system on the configuration of the manipulators may comprise changing the configuration of the manipulators and measuring a resulting change in the optical properties of the projection system.

The method may further comprise adjusting the configuration of the manipulators to the solution configuration of the manipulators.

According to a second aspect of the invention there is provided a method of performing a lithographic exposure comprising determining a configuration of a projection system of a lithographic apparatus according to the first aspect, adjusting the configuration of the projection system using the determined configuration, projecting a patterned radiation beam onto a substrate using the projection system.

According to a third aspect of the invention there is provided a computer program comprising computer readable instructions configured to cause a computer to carry out a method according to the first aspect.

According to a fourth aspect there is provided a computer readable medium carrying a computer program according to the third aspect.

According to a fifth aspect of the invention there is provided a computer apparatus comprising a memory storing processor readable instructions, and a processor arranged to read and execute instructions stored in said memory, wherein said processor readable instructions comprise instructions arranged to control the computer to carry out a method according to the first aspect.

According to a sixth aspect of the invention there is provided a controller configured to control a projection system for a lithographic apparatus, wherein the projection system comprises a plurality of optical elements and a plurality of manipulators operable to manipulate the optical elements so as to adjust the optical properties of the optical elements, thereby adjusting the optical properties of the projection system, the controller being configured to: receive dependencies of the optical properties of the projection system on a configuration of the manipulators, receive a plurality of constraints which correspond to the physical constraints of the manipulators, formulate a cost function, wherein the cost function represents a difference between the optical properties of the projection system for a given configuration of the manipulators and desired optical properties of the projection system, wherein the cost function is formulated using the dependency of the optical properties of the projection system on the configuration of the manipulators, scale the cost function into a scaled variable space, wherein the scaling is performed by using the plurality of constraints and find a solution configuration of the manipulators which substantially minimises the scaled cost function subject to satisfying the plurality of constraints.

According to a seventh aspect of the invention there is provided a projection system for a lithographic apparatus, the projection system comprising a plurality of optical elements, a plurality of manipulators operable to manipulate the optical elements so as to adjust the optical properties of the optical elements, thereby adjusting the optical properties of the projection system and a controller according to the sixth aspect According to an eighth aspect of the invention there is provided a lithographic apparatus comprising: an illumination system configured to condition a radiation beam, a support structure constructed to support a patterning device, the patterning device being capable of imparting the radiation beam with a pattern in its cross-section to form a patterned radiation beam, a substrate table constructed to hold a substrate and a projection system according to the seventh aspect.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
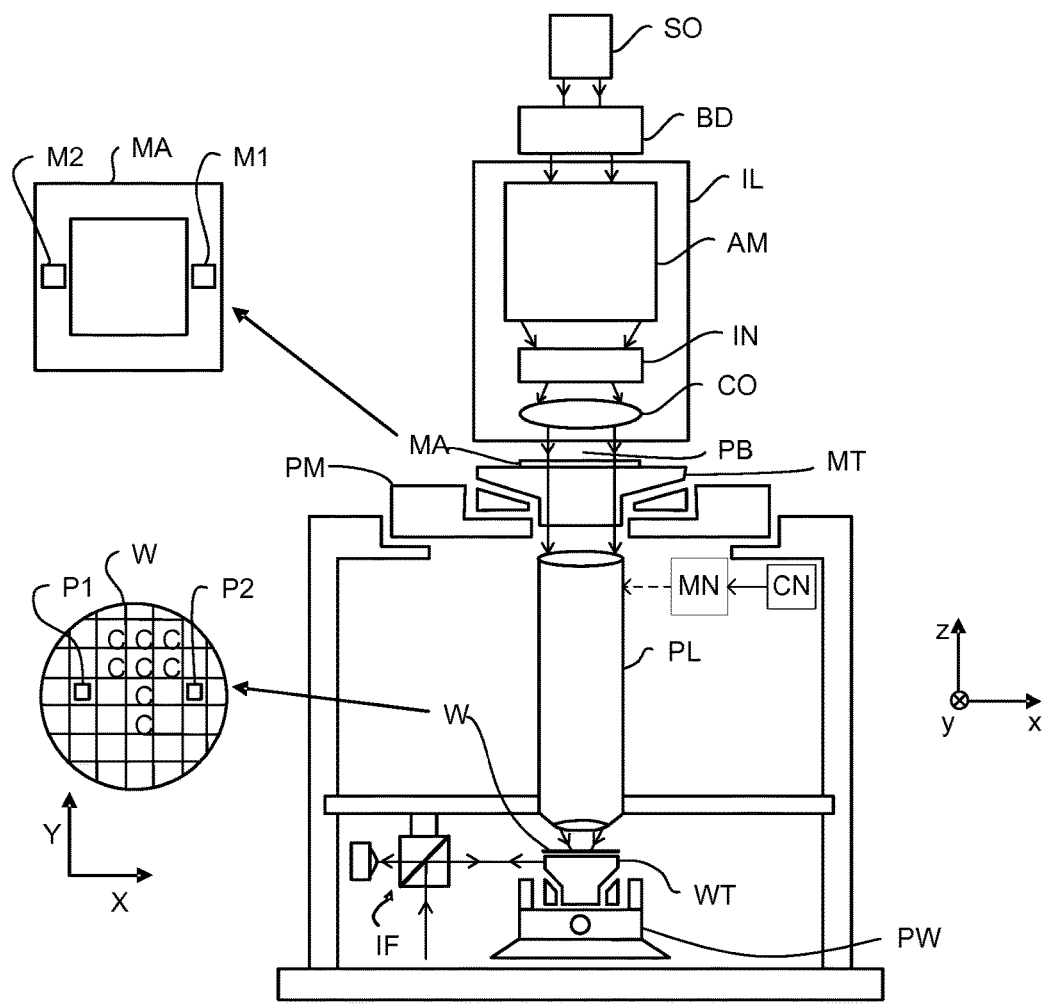
FIG. 1 is a schematic illustration of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 4-20 nm), as well as particle beams, such as ion beams or electron beams.

The term "patterning device" used herein should be broadly interpreted as referring to a device that can be used to impart a radiation beam with a pattern in its cross-section. For example, a radiation beam may be imparted with a pattern in its cross-section in order to create a pattern in a target portion of a substrate. Additionally or alternatively a radiation beam may be imparted with a pattern in its cross-section in order to illuminate a sensor apparatus with a patterned radiation beam. It should be noted that when a pattern is created in a target portion of a substrate, the pattern imparted to a radiation beam may not exactly correspond to a desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus. The apparatus comprises:

an illumination system (illuminator) IL to condition a beam PB of radiation (e.g. UV radiation or DUV radiation);

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained by inserting an optic which provides that illumination mode into the illuminator IL.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the x and/or y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane).

The relative phase of the projection system PL in its pupil plane may be determined by projecting radiation from an object plane of the projection system PL (i.e. the plane of the patterning device MA), through the projection system PL and using a shearing interferometer to measure a wavefront (i.e. a locus of points with the same phase). The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL.

The projection system PL may comprise a plurality of lens elements and may further comprise a controller CN and a plurality of manipulators MN (shown schematically as a single box in FIG. 1) for adjusting the lens elements so as to correct for aberrations (any type of phase variation across the pupil plane throughout the field). To achieve this, the manipulators MN (e.g. actuators) are operable to manipulate lens elements within the projection system PL in one or more different ways so as to alter their optical properties. The controller CN may control the manipulators so as to bring about desired wavefronts at the substrate W.

The projection system may have a co-ordinate system wherein its optical axis extends in the z direction. The manipulators MN may be operable to do any combination of the following: displace one or more lens elements; tilt one or more lens elements; and/or deform one or more lens elements. Displacement of lens elements may be in any direction (x, y, z or a combination thereof). Tilting of lens elements is typically out of a plane perpendicular to the optical axis, by rotating about axes in the x or y directions although a rotation about the z axis may be used for non-rotationally symmetric aspherical lens elements. Deformation of lens elements may include both low frequency shapes (e.g. astigmatic) and high frequency shapes (e.g. free form aspheres). Deformation of a lens element may be performed for example by using actuators to exert force on sides of the lens element and/or by using heating elements to heat selected regions of the lens element. In general, it may not be possible to adjust the projection system PL to correct for apodizations (transmission variation across the pupil plane). The transmission map of a projection system PL may be used when designing masks MAs for the lithographic apparatus LA.

The manipulators MN may comprise any combination of elements which are operable to change the optical properties of the lens elements, thereby changing the optical properties of the projection system PL. The manipulators MN may comprise, for example, one or more actuators configured to alter the position, orientation and/or the shape of the lens elements. The manipulators MN may comprise, for example, one or more heating elements configured to heat one or more regions of a lens element, thereby altering the optical properties of the lens element and the optical properties of the projection system.

The controller CN is operable to determine a suitable configuration of the manipulators MN which causes wavefronts which are formed at the substrate W to approximate a desired wavefront pattern. A desired wavefront pattern may for example, be wavefront pattern in which aberrations at the substrate W are reduced or minimised. Wavefront aberrations may, for example, be expressed as a root mean square (RMS) wavefront error at the substrate W. It may be desirable to determine a configuration of the manipulators MN which reduces or minimises the RMS wavefront error at the substrate W.

The determination of a suitable configuration of the manipulators MN by the controller CN may be performed periodically and the manipulators MN may be periodically adjusted according to the determination. For example, multiple target portions C on a substrate W may be exposed during a process referred to as an exposure process. Subsequently a new substrate W may be loaded onto the substrate table WT (or alternatively a new substrate table WT holding a new substrate W may be moved into position to receive radiation) so as to expose target portions C of the new substrate W as part of a new exposure process.

A desired wavefront pattern at the substrate W which is being exposed may be different during different exposure processes. A suitable configuration of the manipulators MN which brings about a desired wavefront pattern at the substrate W may therefore be determined between exposure processes and the configuration of the manipulators updated accordingly.

Additionally or alternatively the properties of optical elements which form the projection system PL may change during an exposure process. For example, lens elements may undergo local heating during an exposure process which may cause changes in the optical properties of the lens elements. An adjustment to the lens elements may therefore be performed which accounts for any changes in the optical properties of the lens elements which occur over time (e.g. due to heating). For example, a new configuration of the manipulators MN may be determined between exposure processes which accounts for any changes in the optical properties of the lens elements which may have occurred during the previous exposure process.

In some embodiments a configuration of the manipulators MN may be determined which corrects for wavefront aberrations which are caused outside of the projection system PL. For example, wavefront aberrations may be introduced at a patterning device MA in a lithographic apparatus LA (e.g. due to localised heating of the patterning device MA). Wavefront aberrations which are introduced at the patterning device MA (or elsewhere outside of the projection system PL) may be corrected by determining a manipulator configuration which serves to correct for the aberrations. The manipulator configuration may subsequently be updated according to the determined manipulator configuration. In some embodiments the manipulator configuration may be updated during an exposure process in order to correct for aberrations introduced outside of the projection system PL.

In general, determining a suitable manipulator configuration and updating the manipulator configuration according to the determined manipulator configuration may allow wavefront aberrations caused inside and/or outside of the projection system PL to be corrected for. For example, wavefront aberrations which are caused by heating of the patterning device MA and/or wavefront aberrations which are caused by heating of optical elements (e.g. lenses) in the projection system PL may be corrected for.

A determination of the configuration of the manipulators MN which brings about a desired wavefront pattern is based upon knowledge of the dependency of the wavefront pattern on the configuration of the manipulators MN. The dependency of the wavefront pattern on the configuration of the manipulators MN may be referred to as the lens dependencies. The lens dependencies may be determined, for example, during a calibration process. For example, a projection system PL may be calibrated by projecting radiation using the projection system PL and measuring the radiation which is output from the projection system PL. The configuration of the manipulators MN may be adjusted and a resulting change in the radiation which is output from the projection system PL may be measured in order to derive the dependency of the optical properties of the projection system PL on the configuration of the manipulators (i.e. the lens dependencies).

Radiation which is output from the projection system PL may be measured in order to determine wavefront aberrations caused by the projection system PL. Wavefront aberrations may, for example, be measured using an interferometer (e.g. a shearing interferometer).

Additionally or alternatively wavefront aberrations may be corrected for by modelling of the projection system PL. For example, modelling of the projection system PL may be used to determine wavefront aberrations which occur due to heating of the lens elements (e.g. during an exposure process). Modelling of the wavefront aberrations which occur due to heating of the lens elements may be referred to as a lens heating model. A lens heating model may be used to update the lens dependencies during or between exposure process by accounting for heating of the lens elements which occur during an exposure process.

The lens dependencies may be expressed as a lens dependency matrix C whose elements correspond with the derivatives of the manipulator induced wavefront aberrations with respect to the configuration of the manipulators MN. That is, the lens dependency matrix C represents the change in a wavefront which is caused by a given change in the configuration of the manipulators MN. The lens dependency matrix C may include $n_r \times n_v$ elements, where $n_r = n_p \times n_z$, $n_p$ is the number of positions (e.g. positions in a field plane) at which the wavefront is evaluated, $n_z$ is the number of terms with which the wavefront is evaluated (e.g. a number of Zernike polynomial orders which are used to represent the wavefront) and $n_v$ is the number of variables on which the wavefront depends at each position.

The lens dependency matrix C represents a forward model which maps a given configuration of the manipulators MN to a resultant wavefront pattern at the substrate W. Determining a suitable configuration of the manipulators MN which brings about a desired wavefront pattern therefore amounts to an inverse problem which may be solved by inverting the forward model C. In general, there may not be an exact solution to the problem which brings about the desired wavefront pattern and thus the problem is ill-posed. The problem may therefore be reduced to minimizing a cost function F. The cost function F may be expressed by:

$$F(x) = \tfrac{1}{2} \|C \cdot x - d\|^2 \qquad (1)$$

where x is a vector with $n_v$ elements which expresses the configuration of the manipulators MN and d is a vector with $n_r$ elements which expresses the desired wavefront pattern over an exposure field. The minimisation of a cost function F as expressed by equation (1) is of the form of a least squares problem. The double vertical bars in equation (1) represent the norm of the expression inside the double vertical bars. In the embodiments which are described below the norm may be evaluated as the Euclidean norm (2-norm) of the expression inside the double vertical bars. However, in other embodiments, the norm may be evaluated as other forms of the norm (e.g. the uniform or maximum norm). Evaluation of the norm as the Euclidean norm (2-norm) may provide computational efficiency benefits when compared to, for example, evaluating the maximum norm. In some embodiments, the Euclidean norm (2-norm) may therefore be used to approximate a maximum norm in order to improve the computational efficiency of the evaluation.

The configuration of the manipulators MN may be constrained. For example, each manipulator may have a limited range over which it may move, may have a maximum acceleration with which it can accelerate and may have a maximum velocity with which it can move. A manipulator which is configured to apply a heating to a lens element may, for example, have a limited rate at which it can heat a lens element and may have a limited temperature range at which it can operate. Manipulators may be constrained by one or more of the physical constraints described above and/or one or more other physical constraints not mentioned herein. The physical constraints of the manipulators serves to limit the configurations of the manipulators which are physically realisable. The physical constraints of the manipulators may also limit a change in the configuration of the manipulators which be achieved in a given time frame. This may be important, for example, when there is a limited time frame during which manipulator configuration can be updated. For example, between exposure processes a limited time frame may be provided during which the manipulator configuration can be updated and thus this may limit the change in manipulator configuration which is physically realisable between exposure processes.

The solution to the least squares problem as expressed by equation (1) may in some cases represent a configuration of the manipulators MN which is not physically realisable due to the constraints of the manipulators MN. It is therefore desirable to minimise the cost function F subject to satisfying the constraints of the manipulators MN. The constraints of the manipulators may be expressed by:

$$b_l \leq A \cdot x \leq b_u \qquad (2)$$

where A is a constraint matrix, $b_l$ is the lower bounds of the constraints, and $b_u$ is the upper bounds of the constraints. The constraint matrix A is formed of $n_c \times n_v$ elements, where $n_c$ is the number of constraints.

A solution $x_{sol}$ to the constrained problem of minimising the cost function F may be expressed by equation (3).

$$x_{sol} = \min(F(x)), \text{ subject to } b_l \leq Ax \leq b_u \qquad (3)$$

The controller CN may receive the lens dependencies C and the constraints A and may compute a solution configuration of the manipulators MN using the lens dependencies C and the constraints A. In some embodiments the lens dependencies C and the constraints A may be stored in memory and may be sent to the controller for computation of a solution configuration of the manipulators MN. In some embodiments a plurality of different lens dependencies C and/or constraints A may be stored in memory and the controller may select a suitable lens dependencies matrix C and constraints matrix A to receive and to use to compute a solution configuration of the manipulators MN.

In some embodiments a solution $x_{sol}$ to the least squares problem of equation (3) may be sought by performing a singular value decomposition of the lens dependency matrix C. The singular value decomposition of the lens dependency matrix C may be expressed by:

$$C = U \cdot S \cdot V^T \qquad (4)$$

where U and V are unitary matrices and S is a diagonal matrix having $n_r \times n_v$ elements with non-negative numbers on the diagonal. The superscript "T" used in equation (4) denotes the transpose of the matrix V. Singular value decomposition as expressed by equation (4) is a well-known form of factorization of a matrix (in this case the lens dependency matrix C) the computation of which will be well understood by a person having ordinary skill in the art. The singular value decomposition of the lens dependency matrix C may be computed using known techniques such as those provided by commercially available software (e.g. the "svd" function which is provided in the commercially available Matlab software).

The diagonal elements of the diagonal matrix S are referred to as the singular values $\sigma_i$ of the lens dependency matrix C. The singular values $\sigma_i$ are generally ordered on the diagonal of the matrix S in decreasing size such that $\sigma_1 \geq \sigma_2 \geq \sigma_3 \ldots \geq \sigma_m$, where m is the total number of singular values. The columns of the unitary matrix U and the unitary matrix $V^T$ each form a set of orthonormal vectors.

The factorization of the lens dependency matrix C by singular value decomposition may be used to find a solution to the least squares problem in the absence of the constraints given by equation (2). The solution to the unconstrained least squares problem can be shown to be given by equation (5).

$$x_{sol} = VS^{-1}U^T d = \sum_{i=1}^{m} \frac{(U^T \cdot d)_i}{\sigma_i} \cdot V_{:,i} \quad (5)$$

The superscript "T" used in equation (5) denotes the transpose of the matrix U. Whilst equation (5) may be used to find a solution to the least squares problem, the solution may not satisfy the manipulator constraints as expressed by equation (2). One approach to finding a solution which satisfies the manipulator constraints is to start the summation expressed by the right hand side of equation (5) and at each value of i evaluate whether or not the constraints are met. In the event that the constraints are not met, the summation may be terminated and a solution returned which corresponds to the last step at which the constraints are met. Such an approach may be referred to as a truncated singular value decomposition method.

Figure 2:
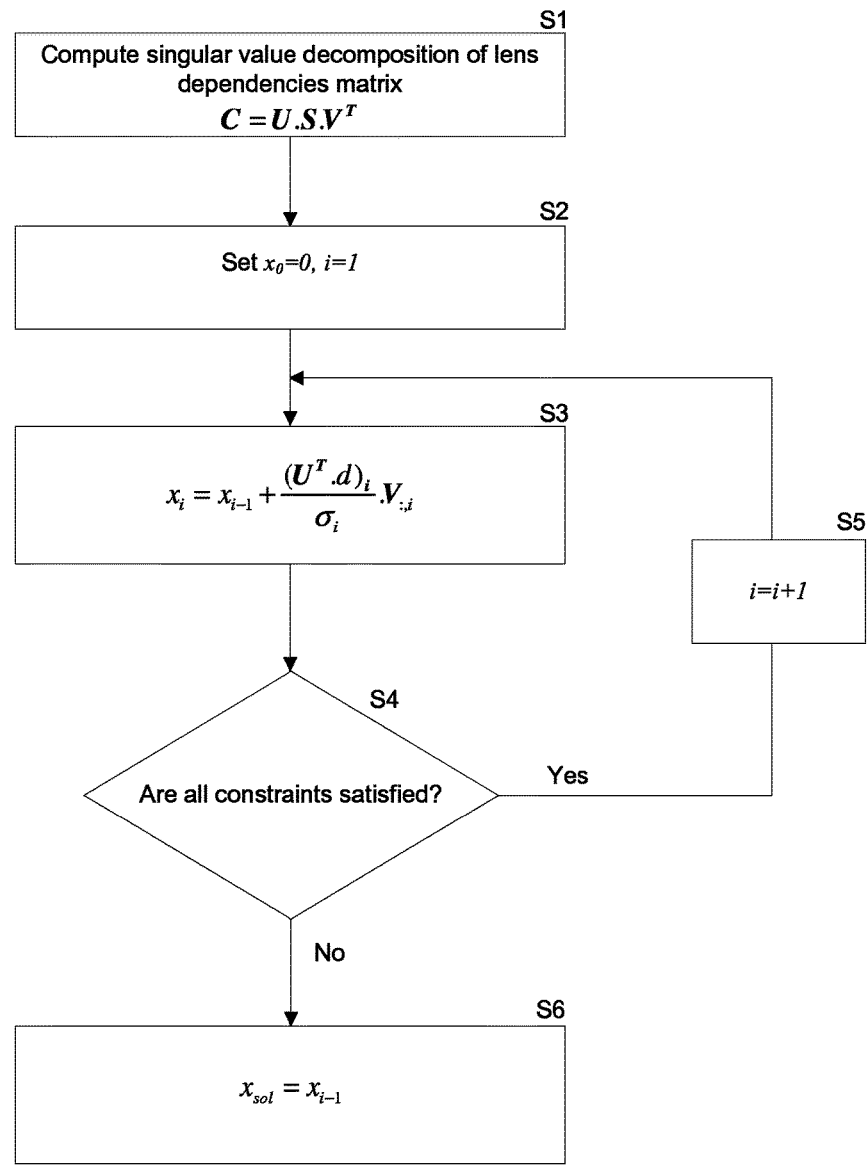
FIG. 2 is a flow chart representing a method of determining a configuration of a projection system of the lithographic apparatus shown in FIG. 1.

FIG. 2 is a flow diagram which outlines the steps of a truncated singular value decomposition method. At step S1 in FIG. 2 the singular value decompositions of the lens dependencies matrix C is computed. At step S2 an initial configuration $x_0$ of the manipulators MN is set to zero and an iteration index i is set to 1. At step S3 the configuration of the manipulators MN is updated with a single term of the summation which is given by the right hand side of equation (5). This step is equivalent to updating the configuration of the manipulators MN such that the cost function F of equation (1) moves towards its minimum value. It will be appreciated that whilst an update of the configuration of the manipulators is described, the update is only performed in terms of a computational step and the physical configuration of the manipulators are not updated at this stage.

Figure 3:
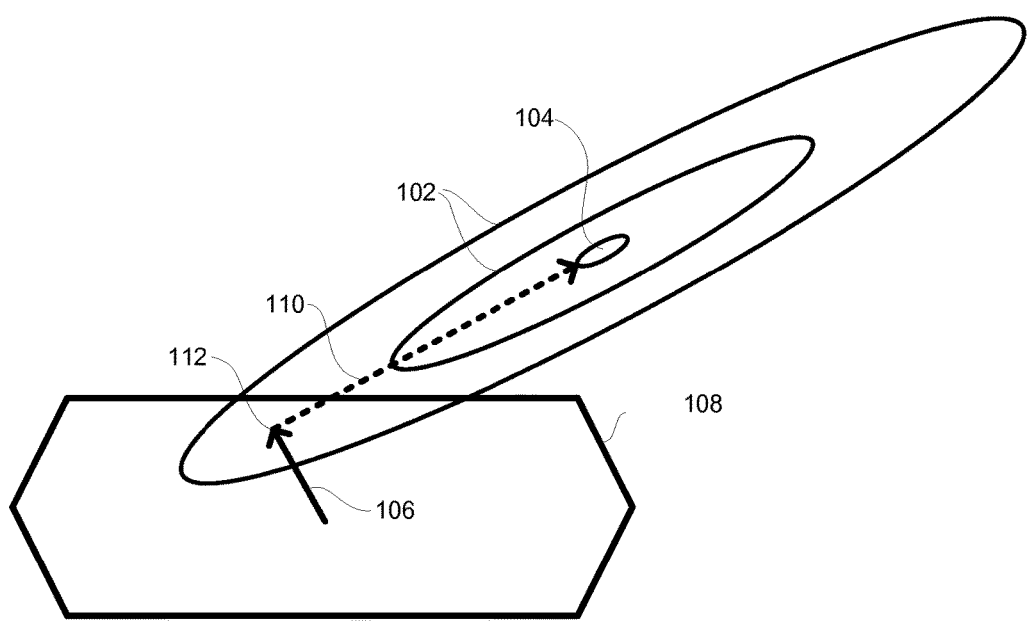
FIG. 3 is a schematic representation of a variable space in which the configuration of a projection system according to the method shown in FIG. 2 is determined.

FIG. 3 is a simplified graphical representation of the cost function F in two-dimensions. The two-dimensions which are shown in FIG. 3 may, for example, correspond to two variables on which the cost function F depends. The cost function F is expressed as contours 102 which extend around a minimum 104. The arrows which are shown in FIG. 3, represent the cost function at different stages of the truncated singular value decomposition method of FIG. 2. A first arrow 106 which is shown in FIG. 3 represents a change in the cost function F which results from a first update of the configuration of the manipulators MN from $x_0$ to $x_1$ at step S3 of the method of FIG. 2.

At step S4 of the method of FIG. 2, the updated configuration of the manipulators MN is checked to see if it satisfies the manipulator constraints as expressed by equation (2). The manipulator constraints are represented in FIG. 3 by a solid line 108. In the representation which is shown in FIG. 3, the constraints are satisfied if the current evaluation of the cost function F remains within the bounds of the solid line 108. It can be seen in FIG. 3 that after a first change 106 in the cost function F which results from a first update of the configuration of the manipulators 108, the cost function F remains within the bounds of the solid line 108 and thus the constraints are satisfied.

In the event that the constraints are satisfied the index i is increment by 1 at step S5 and the method returns to step S3. A further update to the configuration of the manipulators is computed at step S3. The change in the cost function F which results from the newly computed manipulator configuration is represented by a second arrow 110 in FIG. 3.

At step S4, a further check as to whether the updated manipulator configurations satisfy the constraints is carried out. It can be seen from FIG. 3, that the change 110 to the manipulator configurations moves the cost function F towards the minimum 104 of the cost function F but also violates the constraints 108. The method which is shown in FIG. 2 therefore moves to step S6 at which a solution $x_{sol}$ is set to the last manipulator configuration at which the constraints were satisfied and the method is terminated. The method which is shown in FIG. 2 therefore truncates the summation given by the right hand side of equation (5) when the constraints are no longer satisfied and returns a solution which satisfies the constraints. The truncation amounts to summing over only the largest singular values $\sigma_i$. The value of the cost function F of the solution which is returned by the method lies at the end of the first arrow 106 and is labelled 112 in FIG. 3.

It will be appreciated that the representation of the truncated singular value decomposition method which is shown in FIG. 3 is a simple example in which the cost function is shown in only two-dimensions. In practice, the cost function may depend on many more than two variables and can therefore be represented in more than two-dimensions. If the cost function depends on more than two variables then more than the two steps which are shown may be performed before the constraints are not satisfied and the method is trunctated.

As can been seen in FIG. 3, the value 112 of the cost function F of the solution which is returned by the truncated singular value decomposition method is closer to the minimum 104 of the cost function F than the starting point of the method and that the solution satisfies the constraints. However, it can also be seen from FIG. 3 that there are regions in which the constraints are satisfied (where the cost function F remains inside the bounds of the line 108) which lie closer to the minimum 104 of the cost function F than the solution 112. The truncated singular value decomposition method of FIG. 2 does not therefore necessarily find the minimum of cost function F at which the constraints are satisfied.

In some embodiments according to the invention, a solution may be found which lies closer to the minimum 104 of the cost function F by scaling the problem into a scaled variable space. The problem may be rescaled using the constraint matrix A such that the shape of the constraints in the scaled variable space allows a solution to be found which is closer to the minimum of the cost function (when compared to when no scaling is performed), whilst still satisfying the constraints.

An embodiment of a scaling method will now be introduced by way of example only. The cost function F which was previously given by equation (1) may be rewritten as:

$$F(x) = \tfrac{1}{2} x^T \cdot H \cdot x + f^T \cdot x \qquad (6)$$

where:

$$H = C^T \cdot C \qquad (7)$$

$$f = -C^T \cdot d \qquad (8)$$

The minimisation problem may then be summarised as minimising the cost function as given by equations (6)-(8) subject to the constraints as expressed by equation (2). The parameters of the minimisation problem may be scaled into a scaled variable space by use of a diagonal constraint scaling matrix D. A suitable constraint scaling matrix D is given by:

$$D = \mathrm{diag}\left( \frac{2}{b_u - b_l} \right) \qquad (9)$$

Where diag indicates that the vector which lies inside the brackets of equation (9) is placed on the diagonal elements of the diagonal constraint scaling matrix D and all non-diagonal elements are set to zero. The vector which is inside the brackets of equation (9) is calculated by Hadamard (point wise) division.

In addition to scaling the constraints with the constraint scaling matrix D the other parameters of the problem may also be scaled. For example, a variable scaling matrix T and a variable shift column vector t may be introduced and are given as:

$$T = (D \cdot A)^+ \qquad (10)$$

$$t = \frac{b_u + b_l}{2} \qquad (11)$$

where $^+$ is used to denote the Moore-Penrose pseudo inverse of the matrix inside the brackets of equation (10). The Moore-Penrose pseudo inverse may, for example, be calculated by computing a singular value decomposition.

The scaling matrices and vectors which are given in equations (9)-(11) may be used to define a scaled cost function $F_s$ in terms of a scaled manipulator configuration y. The scaled cost function $F_s$ is given by:

$$F_s = \tfrac{1}{2} y^T T^T \cdot H \cdot T \cdot y + (f^T \cdot T - t^T \cdot T^T \cdot H \cdot T) \cdot y \qquad (12)$$

the scaling of the manipulator configuration is governed by:

$$x = T \cdot (y - t) \qquad (13)$$

and the constraints are given by:

$$b_l + A \cdot T \cdot t \leq A \cdot T \cdot y \leq b_u + A \cdot T \cdot t \qquad (14)$$

The problem to be solved in a scaled variable space may therefore be summarised as seeking a solution $y_{sol}$ of the scaled manipulator configuration y which minimises the scaled cost function $F_s$ given in equation (12) subject to the constraints given by equation (14). Once a solution $y_{sol}$ of the scaled manipulator configuration has been found, the solution may be rescaled to find a solution $x_{sol}$ using equation (13).

Figure 4:
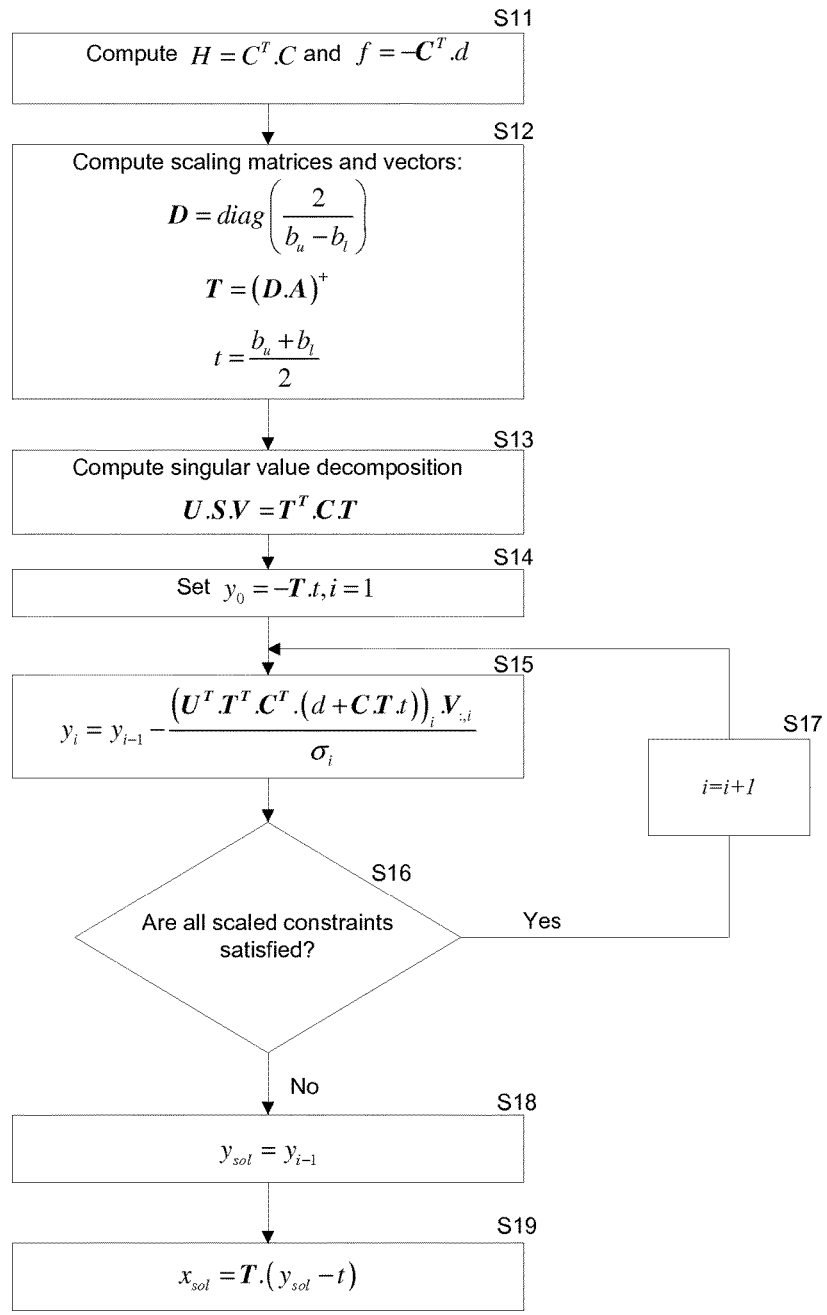
FIG. 4 is a flow chart representing a method of determining a configuration of a projection system according to an embodiment of the invention.

FIG. 4 is a flow diagram which outlines the steps of a method according to an embodiment of the invention which uses a scaled variable space. The method which is presented in FIG. 4 is similar to the method which is presented in FIG. 2 except that the variables are scaled into a scaled variable space. At steps S11 and S12 the scaled variables are computed as was described above with reference to equations (7)-(11). At step S13 a factorisation using singular value decomposition is performed so as to compute the matrices U, S and V. At step S14 initial values of the scaled manipulator configuration $y_0$ and the index i are set.

Figure 5:
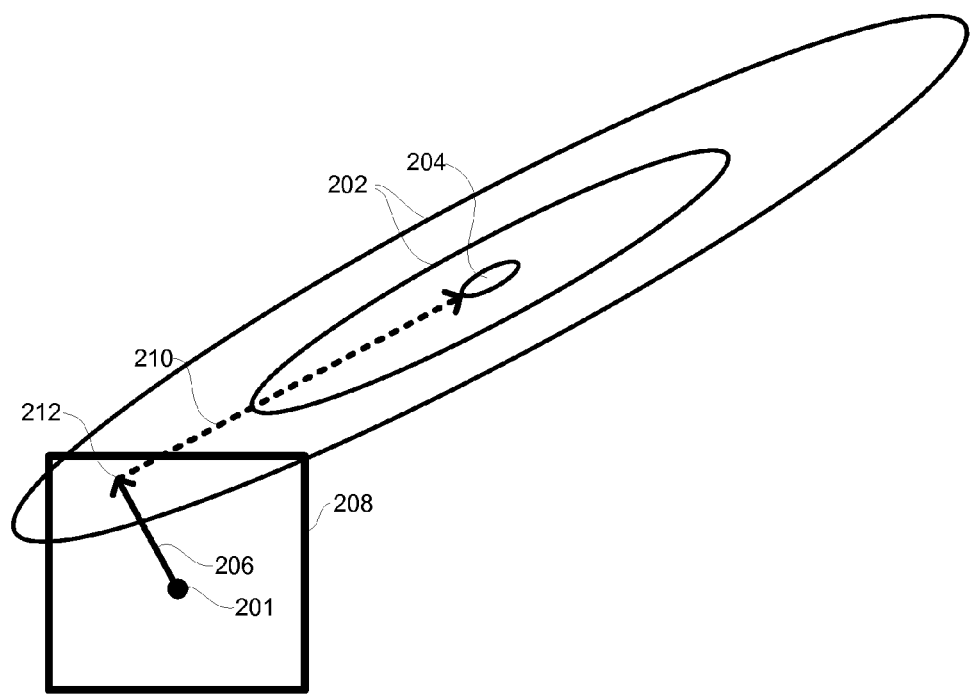
FIG. 5 is a schematic representation of a variable space in which a configuration of a projection system according to the method shown in FIG. 4 is determined.

FIG. 5 is a simplified graphical representation of the scaled cost function $F_s$ as given by equation (12). The scaled cost function $F_s$ is expressed as contours 202 which extend around a minimum 204. The arrows which are shown in FIG. 5, represent the cost function at different stages of the truncated singular value decomposition method of FIG. 5. An initial value of the scaled cost function $F_s$ which results from the initial value $y_0$ of the scaled manipulator configuration is shown as a point 201 in FIG. 5.

At step S15 of the method which is shown in FIG. 4, the scaled manipulator configuration is updated using the matrices which were computed during the singular value decomposition which was computed at step S13. The value $\sigma_i$ which is included in the equation shown at step S15 is the ith singular value which corresponds with the ith element on the diagonal of the matrix S computed at step S13.

The update of the scaled manipulator configuration which is performed at step S13 in FIG. 4 is shown in FIG. 5 by a first arrow 206 which represents the change in the scaled cost function Fs which results from the update in the scaled manipulator configuration. It can be seen from FIG. 5 that the update in the scaled manipulator configuration serves to reduce the value of the scaled cost function Fs.

At step S16 of FIG. 4, the updated scaled manipulator configuration is checked to see if it satisfies the scaled manipulator constraints as expressed by equation (14). The scaled manipulator constraints are represented in FIG. 5 by a solid line 208. When the value of the scaled cost function $F_s$ lies inside the bounds of the solid line 208 then the scaled constraints are satisfied. It can be seen in FIG. 5 that after an initial update of the scaled manipulator configurations, the scaled cost function $F_s$ lies within the bounds of the solid line 208 and thus the scaled constraints are satisfied. The method of FIG. 4 therefore proceeds to increment the index value i at step S17 and returns to step S15.

At step S15 a further update to the scaled manipulator configuration is performed. The further update to the scaled manipulator configuration is represented in FIG. 5 by a dotted arrow 210. At step S16 the new scaled manipulator configuration is checked to see if it satisfies the scaled constraints as expressed by equation (14). It can be seen from FIG. 5 that after the further update of the scaled manipulator configuration, the scaled cost function $F_s$ lies outside of the bounds of the solid line 208 and thus the scaled constraints are not satisfied. The method of FIG. 4 therefore proceeds to step S18 at which a scaled manipulator configuration solution $y_{sol}$ is set to the last manipulator configuration at which the scaled constraints are satisfied. The scaled cost function $F_s$ which corresponds with the scaled manipulator configuration solution $y_{sol}$ is labelled 212 in FIG. 5 and lies at the end of the first arrow 206. At step S19 the scaled manipulator configuration solution $y_{sol}$ is used to find a non-scaled manipulator configuration solution $x_{sol}$ by using equation (13).

It can be seen from a comparison of FIGS. 3 and 5 that by solving the problem in a scaled variable space, the shape of the constraints is altered. In particular, a scaling may be used which allows a solution to be found which lies closer to the minimum of the cost function whilst satisfying the constraints. In the example which is shown in FIG. 5, a scaling is used which transforms the scaled constraints into an approximately square shape. The scaled constraints are shown in FIG. 5 in just two dimensions, however in practice the scaled constraints may span more than two dimensions. In general the scaled constraints may substantially form a polytope in a multidimensional scaled variable space. For example, in some embodiments the scaled constraints may form a polytope which approximates a hypercube or hyperrectangle. In general, it may be desirable to scale the constraints such that they form a shape which has similar proportions in all directions (e.g. a hypercube or a shape which approximates a hypersphere).

By using a scaling which transforms the scaled constraints into a polytope which has similar proportions to a hypercube, the method which is summarised in FIG. 4 and which is depicted schematically in FIG. 5 increases the likelihood of the scaled cost function $F_s$ remaining within the bounds of the scaled constraints for more iterations (when compared to, for example, a case where no scaling is applied). The iterated manipulator configurations may therefore move closer to the minimum of the scaled cost function $F_s$ whilst still satisfying the scaled constraints than if no scaling was applied. The solution which results from the scaled method of FIGS. 4 and 5 may therefore be closer to the true minimum of the cost function than if no scaling were to be applied.

The solution which results from the scaled method of FIGS. 4 and 5 may be used to update the physical configuration of the manipulators. For example, the controller CN may control the manipulators MN such that they adopt the determined configuration. The updated configuration of the manipulators may result in a wavefront pattern at the substrate W which is close to a desired wavefront pattern.

Figure 6:
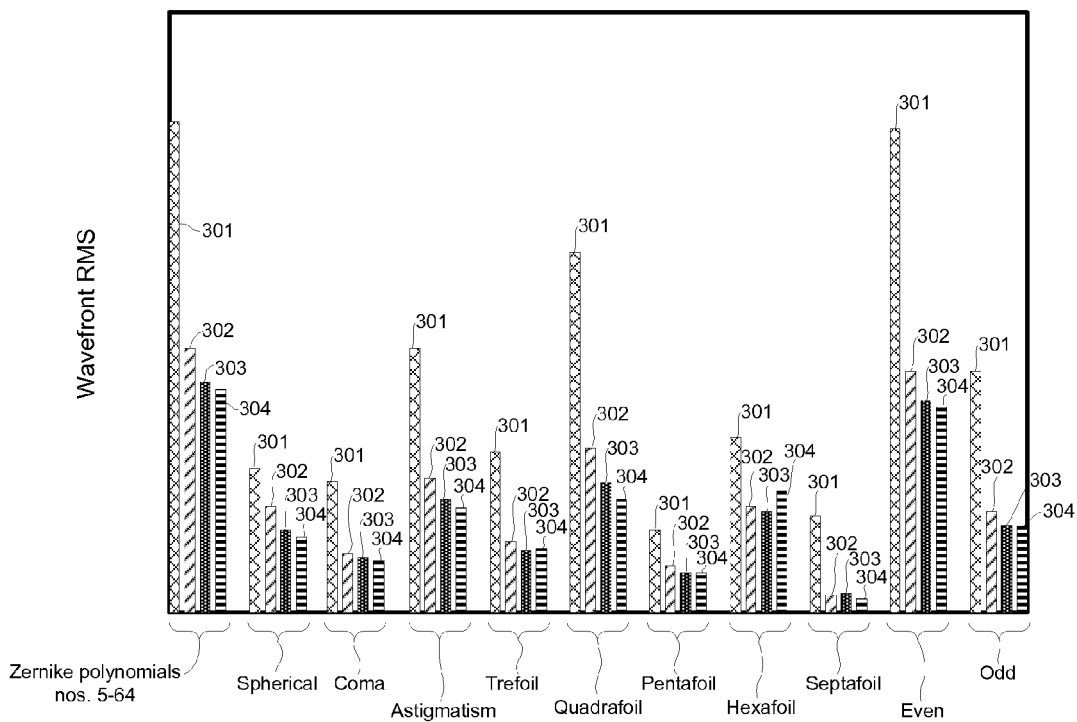
FIG. 6 is a schematic representation of RMS wavefront error which results from different configurations of a projection system.

The scaled method of FIGS. 4 and 5 may be advantageously used to derive a manipulator configuration which satisfies the manipulator constraints and which reduces the difference between a resultant wavefront pattern and a desired wavefront pattern. This may be illustrated by a comparison between the RMS wavefront error which results from solutions found by different methods. FIG. 6 is a schematic representation of the RMS wavefront error which results from four different solutions. The RMS wavefront error is displayed in FIG. 6 for a number of different aberration types.

The bars labelled 301 in FIG. 6 represent the RMS wavefront error when a standard least squares fit technique (representing the prior art) is used to derive the manipulator configuration. The bars labelled 302 in FIG. 6 represent the RMS wavefront error when a scaled truncated singular value decomposition method as represented in FIG. 4 is used to derive the manipulator configuration. The bars labelled 303 in FIG. 6 represent the RMS wavefront error when an optimum solution is found which satisfies the manipulator constraints. The optimum solution may be computed using a method which is in general too time consuming to be used during or between lithographic exposure processes. The optimum solution may, for example be computed using a so called "active set" method. The bars labelled 304 in FIG. 6 represent the RMS wavefront error when an unconstrained solution is found without taking the manipulator constraints in to account. The unconstrained solution represented by the bars labelled 304 is therefore not physically realisable.

The RMS wavefront error is shown for a number of different aberration types. For example the left-hand most set of bars in FIG. 6 represents the RMS wavefront error averaged over Zernike polynomials of orders 5-64. Bars are also shown for the RMS wavefront error associated with spherical, coma, astigmatism, trefoil, quadrafoil, pentafoil, heaxafoil and septafoil type aberrations. Also shown in FIG. 6 are the RMS wavefront errors which are separately averaged over even order Zernike polynomials and odd order Zernike polynomials.

It can be seen from FIG. 6 that for all different types of aberrations, the use of a scaled truncated singular value decomposition method (represented by bars 302) represents a significant improvement over the prior art standard least squares fit technique (represented by bars 301) and results in RMS wavefront errors which are in every case closer to the optimum solution. The scaled truncated singular value decomposition method therefore provides a significant improvement over the prior art.

In some embodiments it may be particularly desirable to reduce the RMS wavefront error which relates to one or more particular types of aberrations. For example, it may more desirable to reduce the RMS wavefront error which relates to even order Zernike polynomials to a greater extent than the RMS wavefront error which relates to odd order Zernike polynomials is reduced (or vice versa).

The RMS wavefront error for given types of aberrations and/or locations may be preferentially reduced, for example, by introducing a weighting to the cost function. For example a weighting matrix W may be formulated. The weighting matrix W may represent weightings at different positions at which the RMS wavefront error is to be reduced and may prescribe a relative weighting to each position. The weighting matrix W may be used in any of the methods which were described above by replacing the lens dependency matrix C with W·C and by replacing the desired wavefront pattern d with W·d so as to introduce a weighting to the cost function.

Introducing a weighting to the cost function may advantageously allow a method for determining manipulator configurations to be adapted to specific applications. For example, a user may require particular weightings to be applied for different uses. The user may be provided with a plurality of different weighting options and may select a weighting option which they require.

In the truncated singular value decomposition methods which were presented above, the method was truncated as soon as the constraints were no longer satisfied and a solution which was returned which represented the last iteration of the method at which the constraints were satisfied. As can be seen, for example, from FIG. 5, the resulting solution 212 of this method may not represent the smallest value of the scaled cost function $F_s$ at which the constraints are satisfied. For example, an iteration which moves partially along the second arrow 210 to meet the edge of the region 208 in which the constraints are satisfied would result in a lower value of the scaled cost function $F_s$ whilst still satisfying the constraints. This may be implemented in the method by backtracking along the last iteration after the constraints are no longer satisfied.

For example, after the iteration which is represented by the second arrow 210 is performed, it is determined that the constraints are no longer satisfied. Rather than returning to the manipulator configuration at the start of the iteration, a series of backtracking steps may be performed whereby steps are taken back along the previous iteration (i.e. back along the second arrow 210), where the steps represent fractions of the previous iteration (i.e. fractions of the length of the second arrow). After each back tracking step is performed it may be determined whether or not the constraints are satisfied. In the event that the constraints are satisfied, the current backtracked solution may be taken as the solution. In the event that the constraints are not satisfied then further backtracking steps may be performed until the constraints are satisfied.

In an alternative embodiment fractional steps along the final iteration may be taken. For example, once it is determined that the final iteration which is represented by the second arrow 210 does not satisfy the constraints, the final iteration may be re-performed in fractional steps. For example, a fraction of the final iteration may be performed (i.e. an iteration along a fraction of the length of the second arrow 210) starting at the end point 212 of the previous iteration 206. After the fractional iteration is performed it may be determined whether or not the constraints are satisfied. If the constraints are satisfied then further fractional iteration steps may be performed until the constraints are no longer satisfied. When the constraints are not satisfied then the end of the last fractional step at which the constraints were satisfied may be taken as the solution.

It is possible, that in some embodiments an iteration may cause the constraints to not be satisfied but that a further iteration may cause the constraints to be satisfied once again. For example, in the representation which is shown in FIG. 5, each iteration of the method may cause an orthogonal step to be taken away from the initial position 201 and generally towards the minimum 204 of the scaled cost function $F_s$. For example after the second iteration 210 which is shown in FIG. 5 (and which causes the constraints to no longer be satisfied) is performed, a third iteration may subsequently be performed which once again causes the constraints to be satisfied.

If the method is truncated as soon as the constraints are not satisfied (as was described above) then the third iteration would not be performed. A potential solution which results from the third iteration and which satisfies the constraints will therefore be ignored. In some embodiments a potential solution which is ignored as a result of truncating the method may correspond to a smaller cost function than the result which is returned by truncating the method. This possibility is at least in part a result of the shape of the scaled constraints in the scaled variable space being a hypercube (or some other polytope) as opposed to a hypersphere.

One way of overcoming this problem is to perform all iterations and then to evaluate the iterations to find the best solution (i.e. the solution having the smallest cost function) which satisfies the constraints. This method is equivalent to deciding where to truncate the summation represented by the right-hand side of equation (5) after having computed every step of the summation. Whilst this method may be more time consuming than truncating the method as the iterations are performed (thereby avoiding the need to perform some iterations), performing all iterations and then evaluating each iteration for the best solution may in some embodiments result in a solution which has a smaller corresponding cost function.

As was explained above, a truncated singular value decomposition method (which may, for example, be performed in a scaled variable space) may be equivalent to truncating a summation (e.g. the summation expressed by the right hand side of equation (5)). Such a truncation may be seen as being equivalent to applying a filter to the summation. For example a solution $x_{sol}$ may be given by:

$$x_{sol} = \sum_{i=1}^{m} j_i \frac{(U^T \cdot d)_i}{\sigma_i} \cdot V_{:,i} \tag{15}$$

where $j_i$ is a filter factor. In the truncated examples which were described above the filter factor $j_i$ may be expressed as:

$$j_i = \begin{cases} 1 \text{ if } i \le k \\ 0 \text{ if } i > k \end{cases} \tag{16}$$

where k is the index value at which the summation is truncated. As was described above the truncation index k may be determined during iterations through the summation or may be determined after all iterations have been performed. Truncating the method as was described above is equivalent to applying a discontinuous filter factor $j_i$ such as the filter factor which is given in equation (16). The truncation methods which were described above may be summarised as finding the largest value of the truncation index k at which the constraints were satisfied.

In other embodiments a continuous filter factor $j_i$ may be used instead of a discontinuous filter factor. For example, a continuous filter factor $j_i$ may be used which is given by:

$$j_i = \frac{\sigma_i^2}{\sigma_i^2 + \beta^2} \tag{17}$$

where $\sigma_i$ are the singular values and $\beta$ is a regularization parameter. The use of the filter factor which is given by equation (17) leads to a solution of the form:

$$x_{sol} = \sum_{i=1}^{m} \frac{\sigma_i^2}{\sigma_i^2 + \beta^2} \frac{(U^T \cdot d)_i}{\sigma_i} \cdot V_{:,i} \tag{18}$$

The solution which is given by equation (18) applies a weighting to the contribution of each singular value and singular vector to the summation by use of the regularization parameter. A method of this form may be referred to as Tikhonov regularization and the regularization parameter $\beta$ may be referred to as the Tikhonov parameter.

Comparing the alternative filter factors $j_i$ which are given by equations (16) and (17) it can be seen that both filter factors are large at small values of i (and large values of $\sigma_i$ since the singular values $\sigma_i$ decrease with increasing i) and small at small values of i (and small values of $\sigma_i$). Using Tikhonov regularization as expressed by equation (18), larger values of the regularization parameter $\beta$ leads to a stronger regularization which decreases the influence of small singular values $\sigma_i$ on the solution. The smaller the value of the regularization parameter $\beta$ the closer the solution will be to an optimum solution at which the cost function is at a minimum. However, as will be understood, for example from the description of truncated methods provided above, an optimum solution may not satisfy the constraints. Tikhonov regularization may be used to find a solution to the constrained problem by finding the smallest value of the regularization parameter β at which the constraints are satisfied. This is equivalent to minimising the cost function subject to the constraints.

Applying the Tikhonov filter function to find a solution as given by equation (18) is equivalent to extending the cost function which is to be minimised. For example, a Tikhonov cost function $F_T$ may be formulated which is given by:

$$F_T = \|C \cdot x - d\|^2 + \beta^2 \|x\|^2 \qquad (19)$$

where, as was described above with reference to equation (1), the double vertical bars represent the norm of the expression inside the double vertical bars. The norm may, for example, be evaluated as the Euclidean norm (2-norm) of the expression inside the double vertical bars. The formulation of the Tikhonov cost function $F_T$ in the form which is given by equation (19) may be referred to as a quadratic penalty method.

In the absence of any constraints a solution of x which minimises the Tikhonov cost function $F_T$ is given by:

$$x = (C^T \cdot C + \beta^2 I)^{-1} C^T \cdot d \qquad (20)$$

where I is an identity matrix. In general the Tikhonov cost function $F_T$ tends to increase with increasing β. One approach to finding a solution which satisfies the constraints could therefore be to search for the smallest value of the regularization parameter β at which the constraints are satisfied. This could be achieved, for example, by varying the regularization parameter β and evaluating the solution to check whether or not the constraints are satisfied. However, the smallest value of the regularization parameter β at which the constraints are satisfied may not always represent the minimum of the cost function F at which the constraints are satisfied. A solution may therefore be returned which is not the best solution.

This is an analogous problem to the problem which was identified above with the truncated singular value decomposition method which was presented with reference to FIGS. 2 and 3. The approach which was taken in the truncated singular value decomposition method was to scale the cost function by using the constraints. This transformed the problem to a scaled variable space in which a solution which was closer to the minimum of the cost function could be found. As will be explained below, an analogous approach may also be taken in a method which utilises Tikhonov regularization.

In a method according to an embodiment of the invention, the manipulator constraint matrix A may be used to scale the Tikhonov cost function $F_T$ to formulate a scaled Tikhonov cost function $F_{ST}$. In order to describe a formulation of a scaled Tikhonov cost function $F_{ST}$ it will be assumed that the manipulator constraints are symmetric. That is, the lower bounds $b_l$ of the constraints, and the upper bounds $b_u$ of the constraints have the same magnitude. The constraints may therefore be expressed as:

$$-b \leq A \cdot x \leq b \qquad (21)$$

where b denotes the magnitude of the constraints. In practice, the constraints may not be symmetric. If the constraints are not symmetric then a similar method to the methods described herein may be used. However for ease of explanation, symmetric constraints will be assumed in the following description.

The symmetric constraints matrix A may be normalized using the magnitude of the constraints b so as to form a normalized constraints matrix $A_b$. The constraints matrix may be normalized such that $A_b = A/b$ and the constraints can be expressed as:

$$-1 \leq A_b \cdot x \leq 1 \qquad (22)$$

The normalized constraints matrix $A_b$ may be used to scale the Tikhonov cost function to form a scaled Tikhonov cost function $F_{ST}$ which may be given, for example, by:

$$F_{ST} = \|C \cdot X - d\|^2 + \beta^2 \|A_b \cdot x\|^2 \qquad (23)$$

A solution of x which minimises the scaled Tikhonov cost function $F_{ST}$ is, similarly to equation (20), given by:

$$x(\beta) = (C^T \cdot c + \beta^2 A_B^T \cdot A_b)^{-1} C^T \cdot d \qquad (24)$$

A solution which satisfies the constraints may be found by varying the regularization parameter β and finding a regularization parameter at which the constraints are barely satisfied. Such a solution may correspond to the smallest value of the scaled Tikhonov cost function Fat which the constraints are satisfied.

Equation (24) provides an expression for the manipulator configuration x as a function of the regularization parameter β. As was explained above it is desirable to find the manipulator configuration x which corresponds to a value of the regularization parameter β at which the constraints are barely satisfied. This is equivalent to seeking to minimise a normalized cost function in terms of a scaled manipulator configuration $x_s(\beta)$, where $x_s(\beta)$ is scaled such that it satisfies the constraints. Such a normalized cost function $F_N$ is given by:

$$F_N = \|C x_s(\beta) - d\|^2 \qquad (25)$$

where $x_s(\beta)$ is given by:

$$x_s(\beta) = \frac{x(\beta)}{\max(1, A_b \cdot x(\beta))} \qquad (26)$$

where $\max(1, |A_b \cdot x(\beta)|)$ is a function which returns the larger of 1 or $|A_b \cdot x(\beta)|$ and $x(\beta)$ is given by equation (24). As was described above, the constraints are satisfied if $|A_b \cdot x(\beta)| \leq 1$. The $\max(1, |A_b \cdot x(\beta)|)$ function ensures that in the event that $|A_b \cdot x(\beta)| > 1$, the manipulator configuration $x(\beta)$ is scaled such that the constraints are satisfied. The scaled manipulator configuration $x_s(\beta)$ is therefore scaled such that it always satisfies the constraints. The minimum of the normalized cost function $F_N$ is therefore equivalent to the minimum of the scaled Tikhonov cost function $F_{ST}$ at which the constraints are satisfied.

Whilst the normalized cost function $F_N$ which is given by equation (25) is described as being a normalized cost function as opposed to a scaled cost function, it will be appreciated that the normalized cost function $F_N$ is equivalent to the scaled Tikhonov cost function $F_{ST}$ which is given by equation (23). The normalized cost function $F_N$ is an embodiment of a scaled cost function which has been scaled into a scaled variable space using the constraints.

In order to minimise the normalized cost function $F_N$ which is given by equation (25), it may be necessary to compute $x(\beta)$ as expressed by equation (24) multiple times. The computation of $x(\beta)$ may be relatively computationally expensive and thus it may be desirable to provide a method of computing $x(\beta)$ multiple times which reduces the computational expense required.

One such method may be to compute the generalized singular value decomposition of the lens dependency matrix C and the normalized constraints matrix $A_b$ which may provide a convenient expression for computing $x(\beta)$. The generalized singular value decomposition of the lens dependency matrix C and the normalized constraints matrix $A_b$ is given by:

$$C = US_C X^T \quad (27)$$

$$A_b = VS_A X^T \quad (28)$$

where U and V are orthogonal matrices and $S_C$ and $S_A$ are diagonal matrices. The diagonal elements of the matrices $S_C$ and $S_A$ may be denoted $c_i$ and $a_i$ respectively. The ratios of the diagonal elements $c_i$ and $a_i$ are the generalized singular values $\gamma_i = c_i/a_i$ of C and $A_b$. Generalized singular value decomposition is a well-known factorisation of two matrices which may be computed using a method known to a person of ordinary skill in the art. For example, the generalized singular value decomposition of C and $A_b$ may be computed using a function provided as part of commercially available software (e.g. Matlab).

A further matrix Y may be defined as $Y = X^{-T}$. Using this matrix and the other matrices as found by the generalized singular value decomposition expressed as equations (27) and (28), $x(\beta)$ may be given by:

$$x(\beta) = \sum_{i=1}^{m} \frac{\gamma_i^2}{\gamma_i^2 + \beta_i^2} \frac{1}{c_i} Y_i \cdot U_i^T \cdot d \quad (29)$$

It will be appreciated that the summation which is given as equation (29) is analogous to equation (18) and the term $$\frac{\gamma_i^2}{\gamma_i^2 + \beta_i^2}$$

can be considered to form a filter function in terms of the generalized singular values $\gamma_i$. Computing the generalized singular value decomposition of C and $A_b$ and expressing $x(\beta)$ as a function of the results of the generalized singular value decomposition (as shown in equation (29)), may allow $x(\beta)$ to be quickly computed for different values of the regularization parameter $\beta$. For example, the generalized singular value decomposition of C and $A_b$ may be computed once and the results used to compute $x(\beta)$ according to equation (29) multiple times for multiple different values of the regularization parameter $\beta$. This may save considerable computational expense when compared to repeatedly computing $x(\beta)$, for example, by using equation (24). Use of a method which involves the computation of the generalized singular value decomposition in the manner described above may be referred to as a generalized Tikhonov regularization method.

An embodiment of a generalized Tikhonov regularization method according to an embodiment of the invention will be described below with reference to FIG. 7 which is a flow chart outlining the method. At step S20 an initial value of the regularization parameter $\beta$ is set and a corresponding manipulator configuration $x(\beta)$ and scaled manipulator configuration $x_s(\beta)$ is computed. The manipulator configuration $x(\beta)$ may be computed, for example, by computing the generalized singular value decomposition of C and $A_b$ and by using equation (29). The scaled manipulator configuration $x_s(\beta)$ may be computed from the manipulator configuration $x(\beta)$ and by using equation (26).

At step S21 the normalized cost function $F_N$ is computed using the scaled manipulator configuration $x_s(\beta)$ which was computed at step S20. At step S22 a determination is made as to whether the normalized cost function $F_N$ computed at step S21 is a minimum of the normalized cost function $F_N$.

The determination of whether or not the normalized cost function $F_N$ is at a minimum or not may be performed using any suitable minimum finding method. For example, in an embodiment a golden section search may be used. Typically a minimum finding method comprises computing several different values of the normalized cost function $F_N$ corresponding to different values of the regularization parameter $\beta$. The regularization parameter $\beta$ may be varied so as to converge to a value of the regularization parameter $\beta$ which corresponds to a minimum of the normalized cost function $F_N$. A golden section search is one example of a minimum finding method which may be used to vary the regularization parameter $\beta$ so as to converge to a value of the regularization parameter $\beta$ which corresponds to a minimum of the normalized cost function $F_N$.

Since the determination of whether or not the normalized cost function $F_N$ computed at step S21 is a minimum is typically performed by comparing the current normalized cost function $F_N$ to multiple previously computed values of the normalized cost function $F_N$, for early iterations there will typically not be sufficient information available to determine whether or not the normalized cost function $F_N$ is a minimum. For early iterations the determination performed at step S22 will therefore typically conclude that the normalized cost function $F_N$ is not a minimum.

In the event that it is determined that the normalized cost function $F_N$ is not a minimum, a new value of the regularization parameter $\beta$ is computed at step S23. The new value of the regularization parameter $\beta$ may be computed at step S23 using a minimum finding method as was described above. The minimum finding method may, for example, review previously computed values of the normalized cost function $F_N$ computed for different regularization parameters $\beta$ and may use these values to determine a change in $\beta$ which is most likely to move towards a minimum of the normalized cost function $F_N$. A golden section search is one example of a suitable method which may be used to determine a new value of the regularization parameter $\beta$ at step S23.

At step S24 a new manipulator configuration $x(\beta)$ is calculated using the new value of the regularization parameter $\beta$ as calculated at step S23. The new manipulator configuration $x(\beta)$ may be calculated, for example, using the generalized singular value decomposition of C and $A_b$ and equation (29). The generalized singular value decomposition of C and $A_b$ may have been previously computed and thus the computational expense of computing a new manipulator configuration $x(\beta)$ at step S24 may be relatively small.

At step S25, a new scaled manipulator configuration $x_s(\beta)$ is computed using the new manipulator configuration $x(\beta)$ calculated at step S24. The new scaled manipulator configuration $x_s(\beta)$ may be computed using equation (26). As was described above, by scaling the manipulator configuration at step S24 a potential solution is computed which satisfies the constraints.

The method returns to step S21 at which a new value of the normalized cost function $F_N$ is computed using the new scaled manipulator configuration $x_s(\beta)$ which was computed at step S25. At step S22 it is determined whether or not the new normalized cost function $F_N$ is at a minimum.

Steps S21-S25 are repeated until it is found at step S22 that the current value of the normalized cost function $F_N$ is at a minimum. If it is determined that the normalized cost function $F_N$ is at a minimum then a solution $\beta_{sol}$ of the regularization parameter is set to the current value of the regularization parameter $\beta$ at step S26. At step S27 a solution $x_{sol}$ of the manipulator configuration is computed as being $x(\beta_{sol})$.

Figure 7:
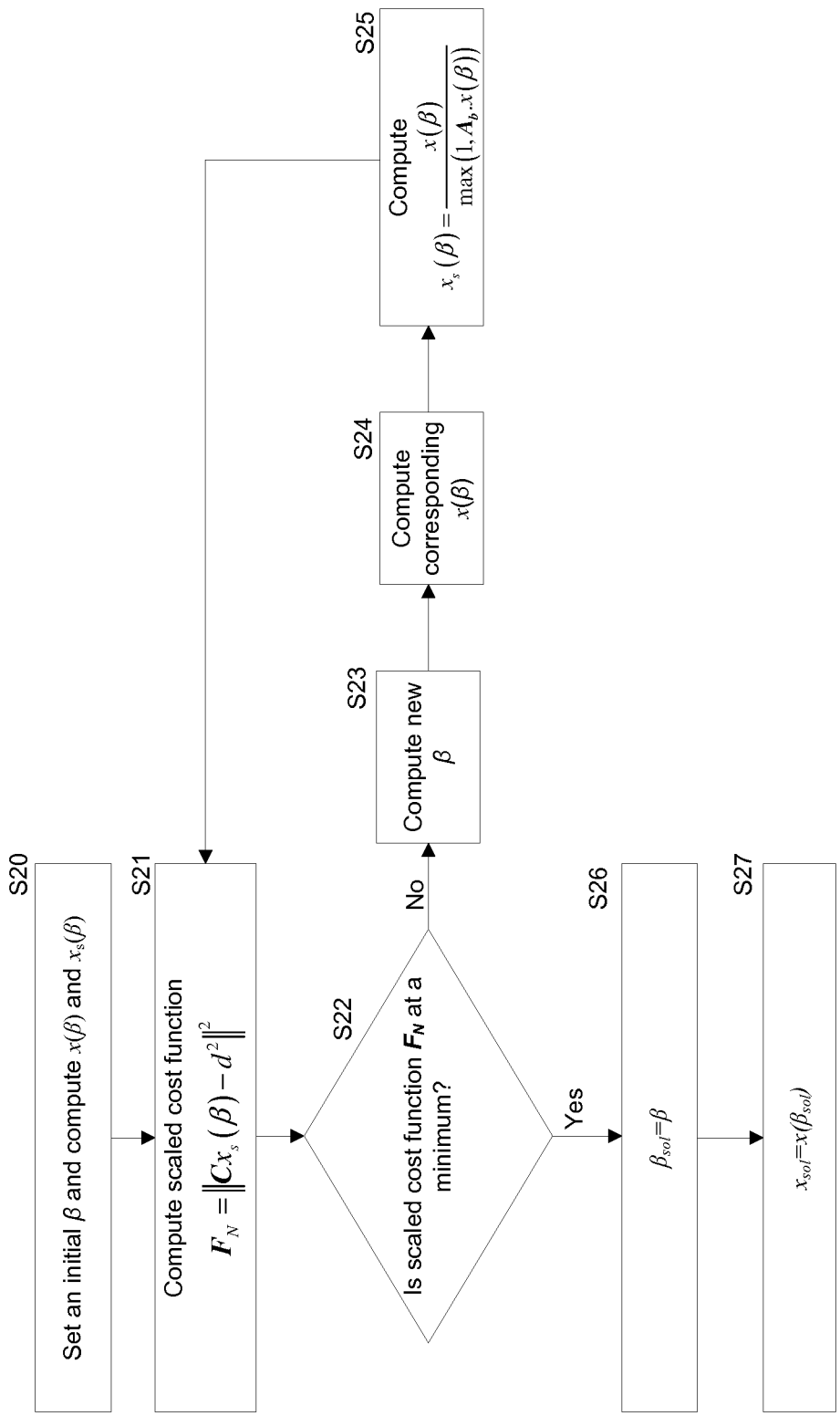
FIG. 7 is a flow chart representing a method of determining a configuration of a projection system according to an alternative embodiment of the invention.

The generalized Tikhonov regularization method which is represented in FIG. 7 and which was described above may achieve fast convergence at a solution which is close to an optimum solution. The generalized Tikhonov regularization method may therefore be particularly advantageous for quickly and accurately calculating a manipulator configuration which results in a desired wavefront pattern in a lithographic apparatus. The solution which is found by the method may be used to adjust the physical configuration of the manipulators in order to perform a lithographic exposure process with the solution configuration of the manipulators.

In some embodiments a weighting may be applied to the cost function in order to optimise the manipulator configuration for one or more types of aberration and/or to reduce wavefront errors at particular locations in a field plane. For example, a weighting matrix W similar to the weighting matrix W which was described above with reference to the truncated singular value decomposition method may also be in conjunction with a generalized Tikhonov regularization method.

Various advantageous methods have been described above for computing a manipulator configuration in a projection system PL of a lithographic apparatus. For example, a scaled truncated singular value decomposition method was presented with reference to FIGS. 4 and 5 and a generalised Tikhonov regularization method was presented with reference to FIG. 7. Both of these methods present significant advancements when compared to the prior art and may be advantageously used to quickly and accurately compute a suitable manipulator configuration which satisfies a set of manipulator constraints. The improvements in computational efficiency which are realised by these methods may allow an updated manipulator configuration to be calculated during a lithographic exposure process or between a lithographic exposure process without introducing any significant delays into the lithographic exposure process which might otherwise reduce the achievable throughput of the process.

Whilst the methods have been explained using specific equations and specific implementations, it will be appreciated that variations to the presented equations and implementations may instead be used.

Whilst the scaled truncated singular value decomposition method and the generalised Tikhonov regularization method which were described above work in slightly different ways, it will be appreciated that the methods also share significant parallels which result in both methods being particularly advantageous. For example, both methods comprise formulating a cost function using the dependency of optical properties of the projection system to the manipulator configuration (e.g. in the form of the lens dependency matrix C), scaling the cost function using a set of manipulator constraints and seeking to find a minimum of the scaled cost function which satisfies the constraints. As was described above in the context of both methods, scaling the cost function advantageously increases the probability of the solution being close to an optimum solution.

Both the scaled truncated singular value decomposition method and the generalised Tikhonov regularization method which were described above, also make use of singular value decomposition or generalized singular value decomposition of a matrix which represents the dependency of optical elements of the projection system on the configuration of the manipulators. As was described above, the singular value decomposition or the generalized singular value decomposition may only need to be computed once each time the method is performed. This may significantly improve the computational efficiency with which a solution may be found and thus may allow an accurate solution to be found relatively quickly. This is particularly advantageous when implementing the method during a lithographic process in which a suitable manipulator configuration may be required within a given time frame.

In the methods which were described above and in which a singular value decomposition or a generalized singular value decomposition is computed, a suitable filter factor was applied to the resulting singular values in order to arrive at a solution. For example, in the scaled truncated singular value decomposition method described with reference to FIGS. 4 and 5 a discontinuous filter is applied to truncate the method. In the generalized Tikhonov regularization method a continuous filter is applied to control the contribution of different singular values to the solution.

Whilst both methods have been described as including the computation of a singular value decomposition or a generalized singular value decomposition, in some embodiments a different form of matrix factorization may instead be used.

Figure 8A:
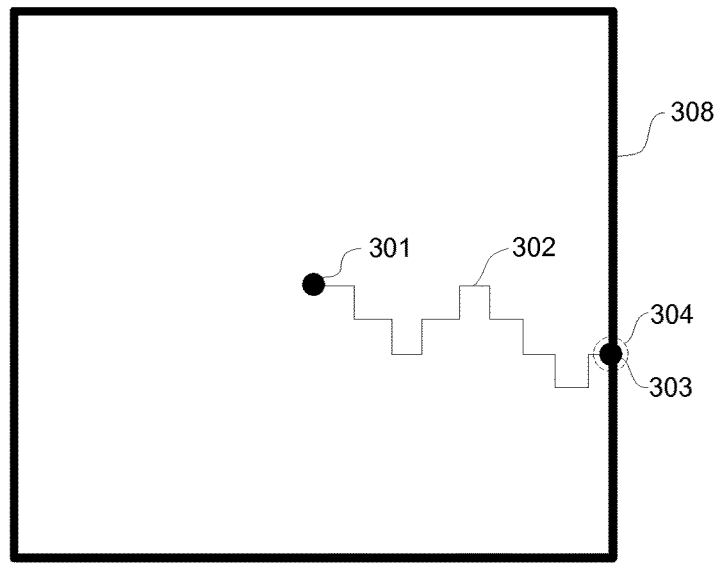
FIGS. 8A and 8B are schematic representations of iterations of a method of determining a configuration of a projection system in which the iterations have different starting points.
Figure 8B:
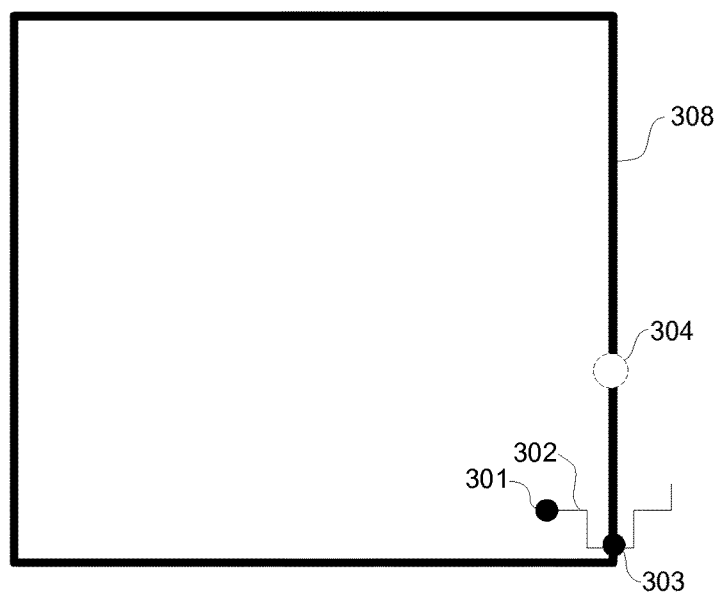

In both methods a starting point for a potential solution is set and a number of iterations performed before arriving at a solution. In some embodiments the choice of starting point may influence the accuracy of the method and/or the time taken to arrive at a solution. This may be best understood in the context of the scaled truncated singular value decomposition method. FIGS. 8A and 8B are schematic representations of a variable space in which a scaled truncated singular value decomposition method is performed. In both FIGS. 8A and 8B a box 308 indicates the constraints in the variable space. Solutions which remain inside the box 308 correspond to solutions which satisfy the constraints. Solutions which lie outside of the box 308 do not satisfy the constraints.

In both FIGS. 8A and 8B a starting point 301 is chosen which represents an initial guess at a solution. A number of iterations are then performed which updates the potential solution until a solution 303 is found. The iterations between the starting point 301 and the solution 303 is shown as a path 302. A region in which an optimum solution lies is indicated by a dashed circle 304.

In the example which is shown in FIG. 8A, the starting point 301 lies roughly at the centre of the variable space which is spanned by the constraints 308. The iterations follow a path 302 which lies entirely within the variable space which is spanned by the constraints 308 before arriving at a solution 303 which lies close to an optimum solution 304.

In the example which is shown in FIG. 8B, the starting point 301 lies close to the edge of the variable space which is spanned by the constraints 308. It will be appreciated that when the starting point 301 lies close to the edge of the variable space which is spanned by the constraints 308, the chances of the path 302 moving outside of the constraints space 308 relatively early in the iteration process is greater than if the starting point 301 is situated further away from the edge of the variable space which is spanned by the constraints 308. This is illustrated in FIG. 8B since the path 302 quickly moves outside of the constraints space 308 at a point at which the potential solution lies a long way from the optimum solution 304. Since the method may be truncated when the constraints are no longer satisfied, the method may return a solution 303 which lies a long way from the optimum solution 304.

In order to avoid the problem which is illustrated in FIG. 8B a starting point 301 which lies relatively near the centre of the constraints 308 may be chosen, as was described with reference to FIG. 8A. Whilst the choice of a starting point 301 has been described with reference to a truncated singular value decomposition method, similar considerations may also apply for a generalized Tikhonov method. The starting point of a generalized Tikhonov method may therefore also be chosen to lie relatively near to the centre of the constraints. In the case of a generalized Tikhonov method, choosing a starting point which lies relatively near to the centre of the constraints may reduce the average number of iterations which are required in order to arrive at a solution, thereby advantageously reducing the amount of computational time required to find a solution.

Figure 9:
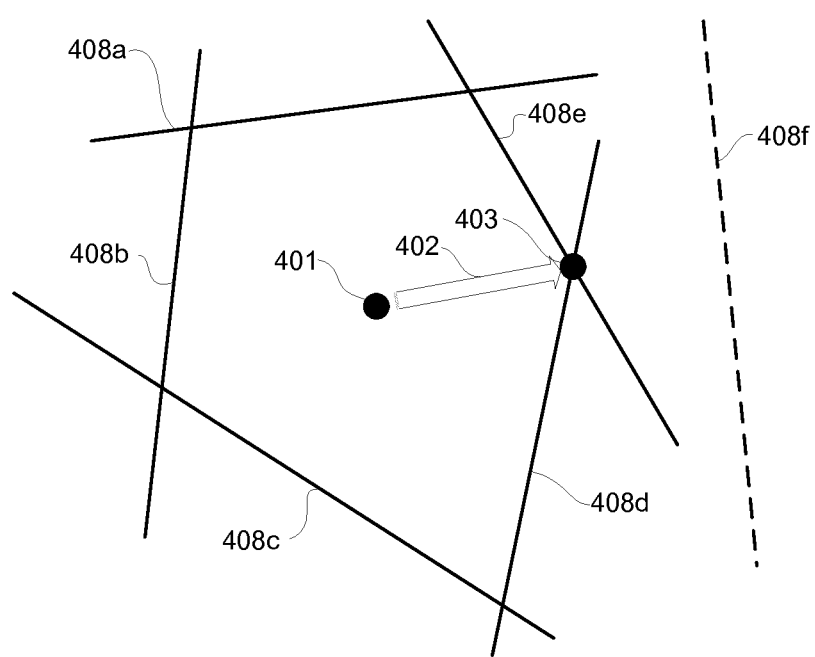
FIG. 9 is a schematic representation of a plurality of constraints which may be used to determine a configuration of a projection system.

In some embodiments, one or more of the constraints may be redundant such that they have no influence on the solution. For example, a constraint may span a variable space which other constraints prevent from being reached. FIG. 9 is a schematic illustration of a variable space which contains a redundant constraint. The variable space contains a plurality of constraints $408a$-$408f$. Each constraint may be checked to see if it is redundant. For example, a sixth constraint $408f$ may be checked to see if is redundant. This may be performed, for example, by choosing a suitable starting point 401 (e.g. a starting point 401 which lies at the geometric centre of the constraints) and moving towards the sixth constraint $408f$ which is being checked. As a path 402 is followed towards the sixth constraint $408f$ which is being checked, it may be determined whether or not the current position satisfies the constraint. The path 402 may be followed until the constraints are no longer satisfied. When the constraints are no longer satisfied, the current position 403 may be checked to see if it lies on the sixth constraint $408f$ which is being tested. If the current position 403 does not lie on the sixth constraint $408f$ which is being tested (as is shown in FIG. 9) then it may be determined that the sixth constraint $408f$ is redundant.

The above described method of checking whether a constraint is redundant may be expressed mathematically as follows. The constraint under test may be expressed as:

$$h^T x \le p \quad (30)$$

and all other constraints may be expressed as:

$$A \cdot x \le b \quad (31)$$

Testing whether or not the constraint which is given by equation (30) is redundant given the set of constraints given by equation (31) may be performed by attempting to maximise $h^T x$ subject to the constraints $A \cdot x \le b$ and $h^T x \le p$. The maximisation of $h^T x$ may, for example, be performed by using a suitable linear programming method known to a person having ordinary skill in the art. If a feasible solution to the maximisation problem is found then it may be determined that the constraint given by equation (30) is not redundant. If no feasible solution to the maximisation problem can be found then it may be determined that the constraint given by equation (30) is redundant.

Using the methods which were described above or similar methods, each constraint belonging to a set of constraints may be tested to see if it is redundant. Each redundant constraint may be removed from the set of constraints which is subsequently used to find a suitable manipulator configuration. Removing redundant constraints from the set of constraints which is used to find a suitable manipulator configuration may advantageously simplify the search for a suitable manipulator configuration and may reduce the computational expense required to find the suitable manipulator configuration.

Whilst embodiments have been described above in which a minimum of a cost function is sought subject to some constraints, a resulting solution may not correspond to the exact minimum of the cost function subject to the constraints. For example, each method which is been presented herein may have limitations which do not allow an exact minimum to be found. Any reference herein to a minimum of a cost function should not therefore be interpreted to mean that an exact minimum is found but should instead be interpreted to mean that the cost function has been reduced to an extent that the limitations of the method allows. Limitations of the method may, for example, include an available amount of computational time in which the method is completed.

In some embodiments, a minimum to a cost function may only be sought to a given accuracy. For example, once a cost function has been reduced to a satisfactory extent, a method for minimising a cost function may be terminated in order to avoid the need for further computational expense which may be required to further reduce the cost function. In this case the cost function may still be considered to have been minimised since it has been minimised within the limitations of the method (which may include a limitation of available computational time).

In some embodiments the methods presented herein may be used to provide an initial estimate of a suitable manipulator configuration. The initial estimate may then be used as a starting point for a secondary method. For example, a minimum to a cost function may be sought to a given accuracy using a method described herein. The result of the method may then form an input to a secondary method which may seek to further minimise the cost function. For example, an active set method may be used further minimise the cost function. Providing a secondary method, such as an active set method, with an initial estimate may substantially reduce the computational time which is required for the secondary method to reach a solution since the starting point of the secondary method will be relatively close to an optimum solution. In embodiments in which the methods described herein are used to provide an input to the secondary method, the methods described herein may still be considered to substantially minimise a cost function even if the secondary method further minimises the cost function.

Any reference to a cost function being at a minimum may not necessarily correspond to an absolute minimum of the cost function. A minimum of a cost function may instead refer only to a local minimum. It should be further appreciated that any reference to being at a minimum should not be limited to being precisely at the minimum but merely substantially at the minimum.

Whilst embodiments have been described above in which a measurement system is of a transmissive type, in other embodiments a reflective type measurement system may be used. For example, the patterning device may comprise reflective patterned regions, the projection system may include one or more reflective optics and/or the detector regions may include reflective optics.

Aspects of the invention have been described above which may carried out using a controller CN. The controller CN may comprise a computer and may, for example, include a CPU (central processing unit) which is configured to read and execute instructions stored in a volatile memory which takes the form of a random access memory. The volatile memory stores instructions for execution by the CPU and data used by those instructions.

Aspects of the invention may be implemented in any convenient form. For example, the invention may be implemented by appropriate computer programs which may be carried on appropriate carrier media which may be tangible carrier media (e.g. disks) or intangible carrier media (e.g. communications signals). Aspects of the invention may also be implemented using suitable apparatus which may specifically take the form of programmable computers running computer programs arranged to implement the invention.

While specific embodiments of the invention have been described above, it will be appreciated that the invention may be practiced otherwise than as described. The description is not intended to limit the invention.

The invention claimed is:

1. A method comprising:
receiving dependencies of optical properties of optical elements of a projection system based on a configuration of manipulators configured to manipulate the optical elements so as to adjust the optical properties of the optical elements;
receiving constraints which correspond to physical constraints of the manipulators;
determining a cost function representing a difference between the optical properties of the projection system for a given configuration of the manipulators and desired optical properties of the projection system, wherein the cost function is formulated using the dependencies of the optical properties of the projection system on the configuration of the manipulators;
scaling the cost function into a scaled variable space, wherein the scaling is performed by using the constraints; and
configuring the manipulators to substantially minimize the scaled cost function subject to satisfying the constraints.

2. The method of claim 1, wherein the configuring comprises calculating iterative adjustments to the configuration of the manipulators and calculating corresponding values of the scaled cost function.

3. The method of claim 1, wherein the configuring comprises performing a factorization of a matrix which represents the dependencies, of the optical properties of the projection system on the configuration of the manipulators.

4. The method of claim 3, wherein the factorization is a singular value decomposition.

5. The method of claim 4, wherein:
the singular value decomposition is a generalized singular value decomposition; and
the generalized singular value decomposition is a generalized singular value decomposition of the matrix which represents the dependencies of the optical properties of the projection system on the configuration of the manipulators and a matrix which represents the constraints.

6. The method of claim 5, wherein the configuring comprises applying a filter function to singular values which result from the factorization, so as to control the contribution of the singular values to the configuring of the manipulators.

7. The method of claim 6, wherein:
the filter function comprises a discontinuous filter function; and
the configuring the manipulators further comprises:
assigning an index to each singular value wherein the index increases with decreasing singular value size; and
determining a truncation index at which to truncate the contribution of the singular values, wherein:
the singular values having an index less than or equal to the truncation index contribute to the configuring of the manipulators; and
the singular values having an index greater than the truncation index do not contribute to the configuring of the manipulators;
wherein determining the truncation index comprises finding a truncation index at which the scaled cost function is substantially minimised subject to satisfying the constraints.

8. The method of claim 6, wherein:
the filter function comprises a continuous filter function; and
the continuous filter function includes a regularization parameter.

9. The method of claim 8, wherein the filter function $j_i$ is of form:

$$j_i = \frac{\gamma_i^2}{\gamma_i^2 + \beta_i^2}$$

wherein, $\gamma_i$ are generalized singular values which result from a generalized singular value decomposition of a matrix which represents the dependencies of the optical properties of the projection system on the configuring of the manipulators and a matrix which represents the constraints,
wherein $\beta_i$ is a regularization parameter; and
wherein i is an index assigned to each generalized singular value, wherein the index increases with decreasing generalized singular value size.

10. The method of claim 1, wherein the configuring the manipulators comprises using a quadratic penalty method.

11. The method of claim 1, further comprising:
applying a weighting to the cost function such that some desired optical properties of the projection system are assigned a greater weighting than other desired optical properties of the projection system.

12. The method of claim 1, further comprising:
determining if any of the constraints are redundant; and
discarding any redundant constraints from the constraints.

13. The method of claim 1, wherein the configuring the manipulators comprises:
setting an initial estimate of the configuring the manipulators; and
iteratively updating an estimate of the configuring the manipulators in order to seek a substantial minimum of the scaled cost function whilst satisfying the constraints.

14. The method of claim 1, further comprising:
determining the dependencies of the optical properties of the projection system on the configuring the manipulators.

15. The method of claim 1, further comprising:
adjusting the configuring.

16. A method of performing a lithographic exposure comprising:
determining a configuration of a projection system of a lithographic apparatus, the determining comprising:
receiving dependencies of optical properties of optical elements of the projection system based on a configuration of manipulators configured to manipulate the optical elements so as to adjust the optical properties of the optical elements;

receiving constraints which correspond to physical constraints of the manipulators;

determining a cost function representing a difference between the optical properties of the projection system for a given configuration of the manipulators and desired optical properties of the projection system; wherein the cost function is formulated using the dependencies of the optical properties of the projection system on the configuration of the manipulators;

scaling the cost function into a scaled variable space, wherein the scaling is performed by using the constraints; and configuring the manipulators to substantially minimize the scaled cost function subject to satisfying the constraints;

adjusting the configuring the manipulators using the determined configuration; and projecting a patterned radiation beam onto a substrate using the projection system.

17. A non-transitory computer readable medium carrying a computer program comprising computer readable instructions configured to cause a computer to perform operations comprising:

receiving dependencies of optical properties of optical elements of a projection system based on a configuration of manipulators configured to manipulate the optical elements so as to adjust the optical properties of the optical elements;

receiving constraints which correspond to physical constraints of the manipulators;

determining a cost function representing a difference between the optical properties of the projection system for a given configuration of the manipulators and desired optical properties of the projection system, wherein the cost function is formulated using the dependencies of the optical properties of the projection system on the configuration of the manipulators;

scaling the cost function into a scaled variable space, wherein the scaling is performed by using the constraints; and configuring the manipulators to substantially minimize the scaled cost function subject to satisfying the constraints.

18. A controller configured to control a projection system for a lithographic apparatus, wherein the projection system comprises a plurality of optical elements and a plurality of manipulators operable to manipulate the optical elements so as to adjust the optical properties of the optical elements, thereby adjusting the optical properties of the projection system, the controller being configured to:

receive dependencies of the optical properties of the projection system on a configuration of the plurality of manipulators;

receive a plurality of constraints which correspond to physical constraints of the plurality of manipulators;

formulate a cost function, wherein the cost function represents a difference between the optical properties of the projection system for a given configuration of the manipulators and desired optical properties of the projection system, wherein the cost function is formulated using the dependencies of the optical properties of the projection system on the configuration of the manipulators;

scale the cost function into a scaled variable space, wherein the scaling is performed by using the plurality of constraints; and find a solution configuration of the manipulators which substantially minimizes the scaled cost function subject to satisfying the plurality of constraints.

19. A projection system for a lithographic apparatus, the projection system comprising:

a plurality of optical elements;

a plurality of manipulators configured to manipulate the plurality of optical elements so as to adjust optical properties of the plurality of optical elements, thereby adjusting optical properties of the projection system; and a controller configured to control the projection system for lithographic apparatus, the controller configured to:

receive dependencies of the optical properties of the projection system on a configuration of the plurality of manipulators;

receive a plurality of constraints which correspond to physical constraints of the plurality of manipulators;

formulate a cost function, wherein the cost function represents a difference between the optical properties of the projection system for a given configuration of the plurality of manipulators and desired optical properties of the projection system, wherein the cost function is formulated using the dependencies of the optical properties of the projection system on the configuration of the plurality of manipulators;

scale the cost function into a scaled variable space, wherein the scaling is performed by using the plurality of constraints; and find a solution configuration of the plurality of manipulators which substantially minimizes the scaled cost function subject to satisfying the plurality of constraints.

20. A lithographic apparatus comprising:

an illumination system configured to condition a radiation beam;

a support structure constructed to support a patterning device, the patterning device configured to impart the radiation beam with a pattern in its cross-section to form a patterned radiation beam;

a substrate table constructed to hold a substrate; and a projection system comprising:

a plurality of optical elements;

a plurality of manipulators operable to manipulate the plurality of optical elements so as to adjust optical properties of the plurality of optical elements, thereby adjusting optical properties of the projection system; and a controller configured to control the projection system for the lithographic apparatus, the controller being used to:

receive dependencies of the optical properties of the projection system on a configuration of the plurality of manipulators;

receive a plurality of constraints which correspond to physical constraints of the plurality of manipulators;

formulate a cost function, wherein the cost function represents a difference between the optical properties of the projection system for a given configuration of the plurality of manipulators and desired optical properties of the projection system, wherein the cost function is formulated using the dependencies of the optical properties of the projection system on the configuration of the plurality of manipulators;

scale the cost function into a scaled variable space, wherein the scaling is performed by using the plurality of constraints; and find a solution configuration of the plurality of manipulators which substantially minimizes the scaled cost function subject to satisfying the plurality of constraints.

* * * * *